(12) United States Patent
Liu et al.

(10) Patent No.: US 8,005,208 B2
(45) Date of Patent: Aug. 23, 2011

(54) SEALING ASSEMBLY AND SLIDING COVER MECHANISM USING THE SEALING ASSEMBLY

(75) Inventors: Ye Liu, Shenzhen (CN); Hsiao-Hua Tu, Taipei Hsien (TW); Xin-Quan Zhou, Shenzhen (CN); Xu-Ri Zhang, Shenzhen (CN)

(73) Assignees: Shenzhen Futaihong Precision Industry Co., Ltd., ShenZhen, Guangdong Province (CN); FIH (Hong Kong) Limited, Kowloon (HK)

( * ) Notice: Subject to any disclaimer, the term of this patent is extended or adjusted under 35 U.S.C. 154(b) by 534 days.

(21) Appl. No.: 12/184,325

(22) Filed: Aug. 1, 2008

(65) Prior Publication Data

US 2009/0165388 A1 Jul. 2, 2009

(30) Foreign Application Priority Data

Dec. 27, 2007 (CN) .......................... 2007 1 0203453

(51) Int. Cl.
*H04M 1/00* (2006.01)
*H04M 9/00* (2006.01)
(52) U.S. Cl. .................... 379/433.11; 379/437; 379/438

(58) Field of Classification Search ............. 379/433.01, 379/433.05, 433.11–433.13, 437, 438, 451; 455/575.1, 575.3, 575.4; 361/752, 756
See application file for complete search history.

(56) References Cited

U.S. PATENT DOCUMENTS
2007/0270180 A1 11/2007 Takagi

FOREIGN PATENT DOCUMENTS
CN 1461133 A 12/2003

*Primary Examiner* — Tuan Nguyen
(74) *Attorney, Agent, or Firm* — Steven M. Reiss

(57) ABSTRACT

The invention discloses a sealing assembly (40) includes a first sealing member (41) and a second sealing member (46) tightly cooperating with the first sealing member (41). The first sealing member (41) has a first assembling side surface (411), and the second sealing member (46) has a second assembling surface (461) facing the first assembling side surface (411). The first assembling side surface (411) and the second assembling side surface (461) form an assembly hole (43) there between. The invention also provides a sliding cover mechanism (100) using the sealing assembly (40).

4 Claims, 6 Drawing Sheets

SEALING ASSEMBLY AND SLIDING COVER MECHANISM USING THE SEALING ASSEMBLY

BACKGROUND

1. Field of the Invention

The present invention generally relates to a sealing assembly, and particularly to a sliding cover mechanism using the sealing assembly.

2. Discussion of the Related Art

With the development of wireless communication and information processing technologies, sliding portable electronic devices such as mobile phones and personal digital assistants (PDAs) are now in widespread use, and consumers may now enjoy the full convenience of high technology products almost anytime and anywhere.

A conventional sliding portable electronic device includes a first body, a second body and a flexible printed circuit (FPC). The first body is slidingly assembled with the second body, and the first body and the second body are electronically connected by the flexible printed circuit. The first body includes a first shell, and the first shell defines a first bar hole there-through. The second body includes a second shell, and the second shell defines a second bar hole there-through corresponding to the first bar hole. One end of the FPC penetrates through the first bar hole of the first shell, and electronically connects with the first body, and the other end of the FPC penetrates through the second bar hole of the second shell, and electronically connects with the second body. However, during usage, the sliding portable electronic device may be accidentally dropped into water, or drenched in rain. As such, the water may infiltrate the first body and the second body through the first or second bar holes, causing damage to the electronic components and circuit board of the electric device.

Therefore, there is room for improvement within the art.

BRIEF DESCRIPTION OF THE DRAWING

Many aspects of the present sealing assembly can be better understood with reference to the following drawings. The components in the drawings are not necessarily drawn to scale, the emphasis instead being placed upon clearly illustrating the principles of the present sealing assembly. Moreover, in the drawings, like reference numerals designate corresponding parts throughout the several views.

DETAILED DESCRIPTION OF THE EMBODIMENT

Figure 1:
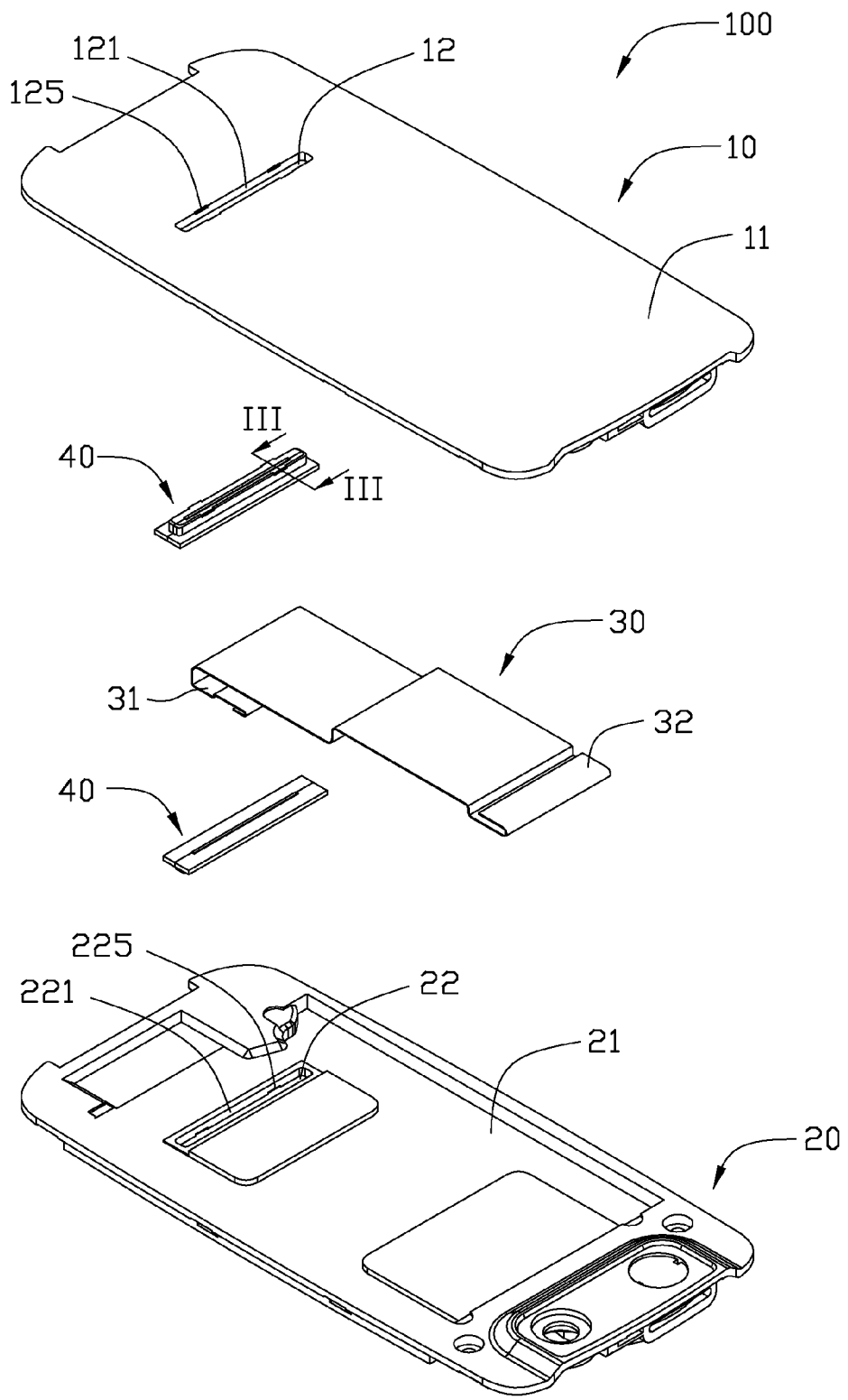
FIG. 1 shows a schematic, exploded, perspective view of a sliding cover mechanism, with a sealing assembly mounted thereon.

The present sealing assembly is particularly suitable for sliding portable electronic devices, such as mobile phones, PDAs, etc. Referring now to the drawings in detail, FIG. 1 shows a schematic, perspective view of a sliding cover mechanism 100, with a sealing assembly mounted thereon. The sliding cover mechanism 100 is configured for electronically connecting with the first body (not completely shown) and the second body (not completely shown) of the sliding portable electronic device (not shown). The first body is slidingly assembled with the second body, and the first body and the second body are electronically connected by a flexible printed circuit (FPC) 30. The sliding cover mechanism 100 includes a first shell 10, a second shell 20, an FPC 30 and two sealing assemblies 40.

The first body of the sliding portable electronic device includes a first substantially rectangular shell 10. The first shell 10 includes an upper surface 11, a first bar hole 12 defined through the upper surface 11 by two parallel first walls 121. The first bar hole 12 is configured for allowing one end of the FPC 30 to pass therethrough to electronically connect with the circuit board of the first body. Each first wall 121 is adjacent to the upper surface 11 and defines two first gaps 125. The two first gaps 125 are substantially rectangular and extend through the upper surface 11.

The second body of the sliding portable electronic device includes a substantially rectangular second shell 20. The second shell 20 includes an upper surface 21, a second bar hole 22 defined through the upper surface 21 and two parallel second walls 221. The second bar hole 22 is configured for allowing the other end of the FPC 30 to pass therethrough to electronically connect with the circuit board of the second body. Each second wall 221 is adjacent to the lower surface (not shown) and defines two second gaps 225 therein. The two second gaps 225 are substantially rectangular, and extend through the lower surface.

The flexible circuit board 13 is substantially a rectangular strap. One end of the circuit board 13 has a first connecting end 31 mounted thereon, and the other end of the circuit board 13 has a second connecting end 32 mounted thereon. The first connecting end 31 and the second connecting end 32 pass through the first bar hole 12 of the first shell 10 and the second bar hole 22 of the second shell 20, respectively, to electronically connect with the circuit boards of the first body and the second body, respectively.

Figure 2:
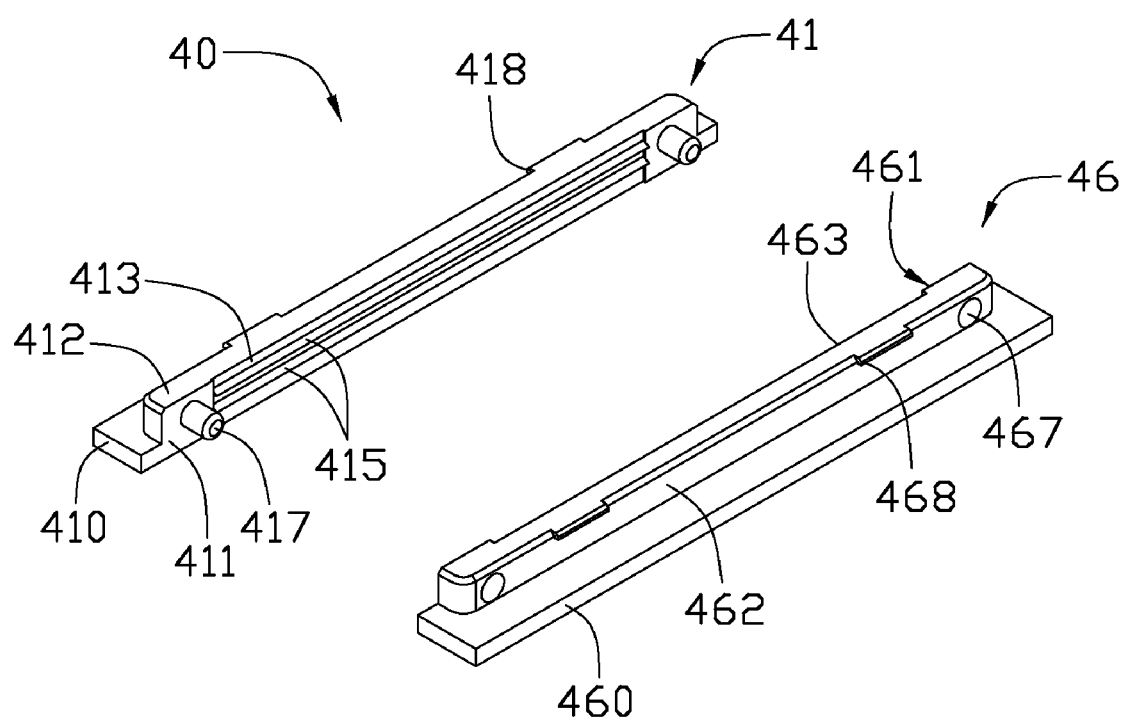
FIG. 2 shows a disassembled perspective view of the sealing assembly in FIG. 1.

Also referring to FIG. 2, the two sealing assemblies 40 are made of elastic material, and are configured for being assembled within the first bar hole 12 and the second bar hole 22, respectively, to seal the joints interconnecting the flexible circuit board 30, the first shell 10 and the second shell 20. The sealing assembly 40 includes a first sealing member 41 and a second sealing member 46 corresponding to the first sealing member 41. The first sealing member 41 includes a first rectangular base 410, and a first protuberance 412 protruding from the first base 410. The first protuberance 412 extends perpendicularly upward from base 410 and forms a first assembling side surface 411 that is substantially T shaped. The first assembling side surface 411 defines a first groove 413, width of which is corresponding to that of the FPC 30 such that the FPC 30 may pass through the first groove 413. Two parallel sealing bar protrusion 415 are formed on the bottom of the first groove 413 and parallel to the first base 410. The sealing bar protrusion 415 has a substantially triangle prism section, and protrudes out of the first assembling side surface 411. Two ends of each sealing bar protrusion 415 contact with the two side surfaces of the first groove 413, respectively. The first protuberance 412 has a post 417 protruding from each end of first assembling side surface 411. The first groove 413 is located between the two posts 417. The first protuberance 412 has two spaced apart first blocks 418 protruding from a surface thereof opposite to the first assembling side surface 411 and are spaced apart. The two spaced apart first blocks 418 correspond to the two first gaps 125 and the two second gaps 225, to assemble with each other.

The second sealing member 46 has substantially the same shape as the first sealing member 41, and engages with the first sealing member 41 to be assembled within the first bar hole 12 or the second bar hole 22. The second sealing member 46 includes a substantially rectangular second base 460, and a second protuberance 462 protruding from the second base 460. The second protuberance 462 has a second assembling side surface 461 that is substantially T shaped. The second assembling side surface 461 defines a second groove 463 thereon corresponding to the first groove 413 of the first sealing member 41. The second groove 463 and the first groove 413 form an accommodating space configured for accommodating the FPC 30. Each end of the second protuberance 462 includes a through hole 467 defined therethrough corresponding to the posts 417. The second protuberance 462 has two spaced apart second blocks 468 protruding from a surface thereof opposite to the first assembling side surface 461 and are spaced apart. The two spaced apart second blocks 468 correspond to the two first gaps 125 and the two second gaps 225, to assemble with each other.

Figure 3:
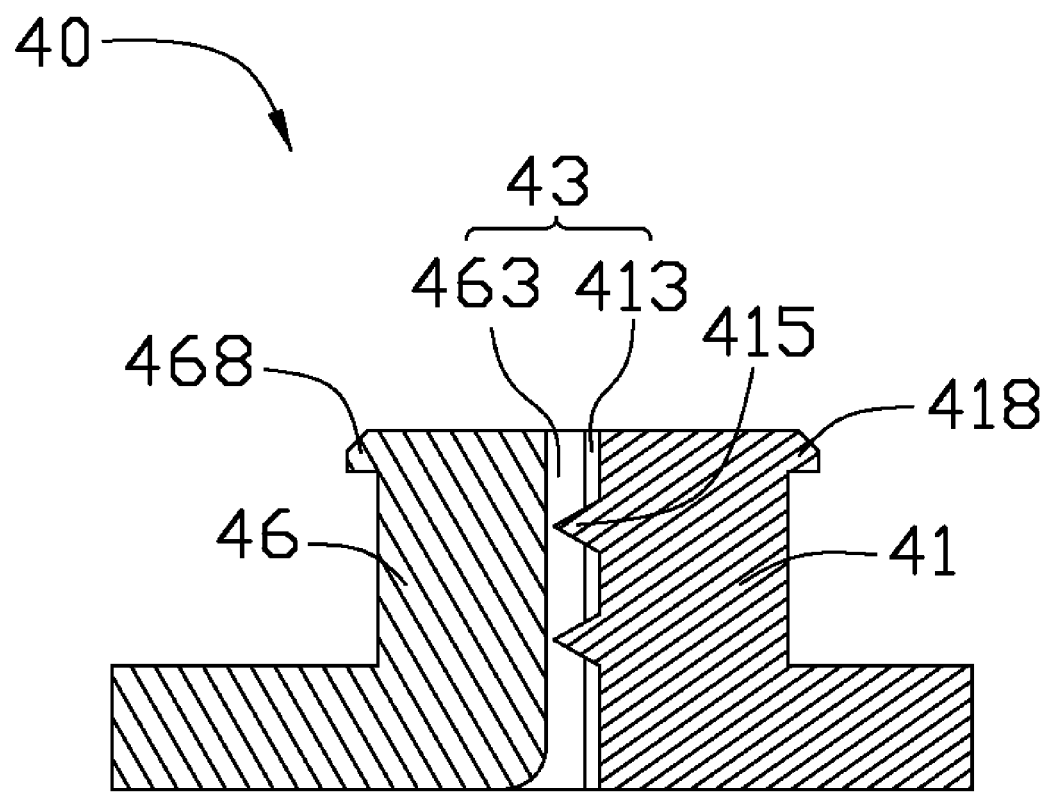
FIG. 3 is a cut-away view of the sealing assembly shown in FIG. 1, in the direction identified by arrow III-III in FIG. 1.

Referring to FIG. 3, when the first protuberance 412 of the first sealing member 41 is assembled with the second protuberance 462, the two posts 417 are penetrated through the two through holes 467 of the second protuberance 462, respectively, and the first sealing member 41 and the second sealing member 46 are tightly assembled with each other. The first groove 413 and the second groove 463 form an assembly hole 43. The assembly hole 43 is configured for assembling the FPC 30. Meanwhile, the first assembling side surface 411 of the first sealing member 41 abuts the second assembling side surface 461 of the second sealing member 46. The two sealing bar protrusion 415 of the first sealing member 41 are accommodated within the second groove 463 of the second sealing member 46.

Figure 4:
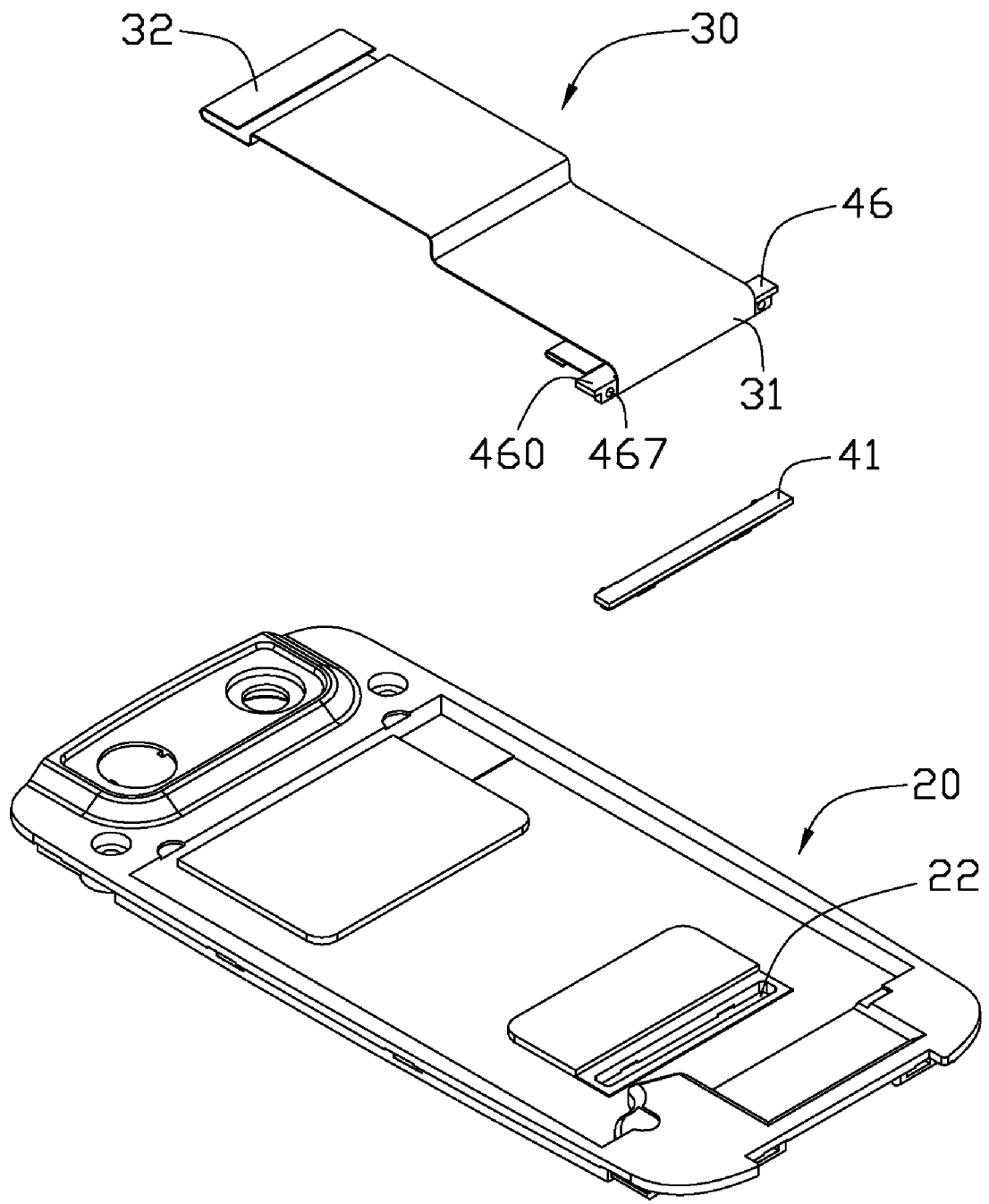
FIG. 4 is a schematic, perspective view of the first assembling step of the sliding cover mechanism.

Referring to FIG. 3 and FIG. 4, in assembly, the first connecting end 31 of the FPC 30 penetrates through the second groove 463 of the second sealing member 46, and is accommodated therein. The two posts 417 of the first sealing member 41 are inserted through the two through holes 467 of the second sealing member 46, respectively, to make the first sealing member 41 tightly engage with the second sealing member 46. The FPC 30 is clamped within the assembly hole 43 formed between the first groove 413 and the second groove 463, meanwhile, the two sealing bar protrusion 415 of the first sealing member 41 abut tightly against the FPC 30, and tightly contact with the second groove 463 of the second sealing member 46.

Figure 5:
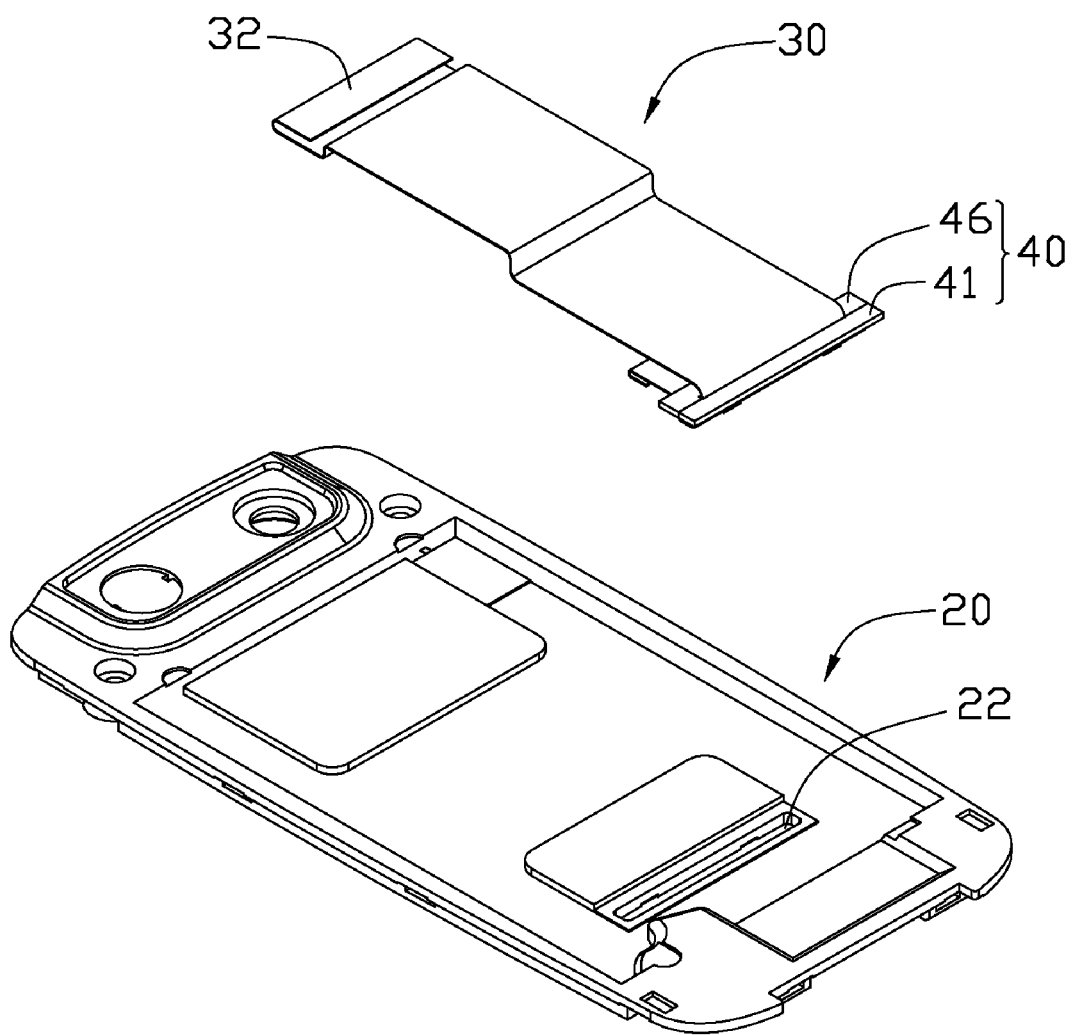
FIG. 5 is a schematic, perspective view of the second assembling step of the sliding cover mechanism.
Figure 6:
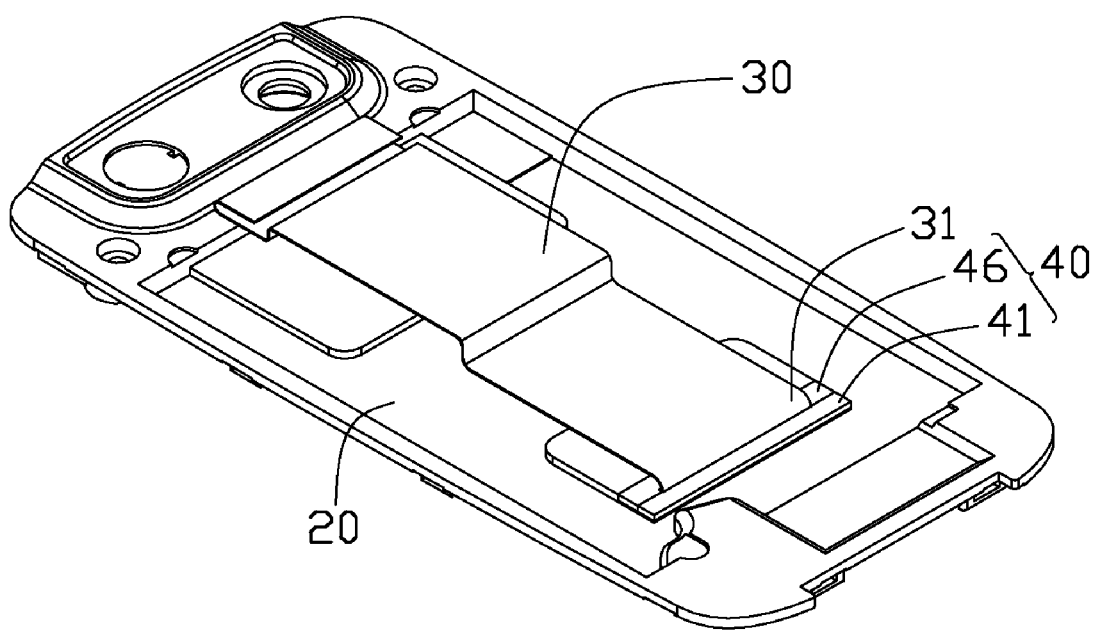
FIG. 6 is a schematic, perspective view of the third assembling step of the sliding cover mechanism.

Also referring to FIGS. 5 and 6, the FPC 30 and the sealing assemblies 40 are assembled on the second shell 20. The first connecting end 31 of the FPC 30 is inserted through the second bar hole 22 of the second shell 20, and the sealing assemblies 40 is assembled with the second bar hole 22 of the second shell 20. The first protuberance 412 and the second protuberance 462 of the sealing assemblies 40 are tightly accommodated within the second bar hole 22. The first block 418 of the first protuberance 412 and the second block 468 of the second protuberance 462 are engaged within the second gaps 225 of the second bar hole 22, respectively. The same method described above can be used to assemble the second connecting end 32 of the FPC 30 with the other sealing assemblies 40 and the first shell 10.

It is understood that the amount of the present sealing bar protrusion 415 are not just limited to the two sealing bar protrusion 415, the amount also can be increased or decreased by the needs. For example, the amount of the present sealing bar protrusion 415 can be one or more than two.

It is understood that the bar protrusion 415 is not just limited to the triangle prism in shape. The bar protrusion 415 also may be other shapes.

It is understood that the second groove 463 of the second sealing member 46 also can be omitted.

It is to be understood, however, that even though numerous characteristics and advantages of the present invention have been set forth in the foregoing description, with details of the structure and function of the present invention, the disclosure is illustrative only, and changes may be made in detail, especially in matters of shape, size, and arrangement of parts within the principles of present invention to the full extent indicated by the broad general meaning of the terms in which the appended claims are expressed.

What is claimed is:

1. A sealing assembly for a flexible printed circuit in a portable electronic device comprising:
   a first sealing member having a first assembling side surface; and
   a second sealing member tightly cooperating with the first sealing member, the second sealing member having a second assembling side surface facing the first assembling side surface; the first assembling side surface and the second assembling side surface cooperatively defining an assembly hole there between;
   wherein the assembly hole includes a first groove defined in the first assembling side surface and a second groove defined in the second assembling side surface corresponding to the first groove; the first sealing member has at least one sealing bar protrusion formed on the bottom of the first groove, and protruding out of the first assembling side surface.

2. The sealing assembly as claimed in claim 1, wherein the first sealing member includes a first base and a first protuberance protruding from the first base, the first protuberance and the base form the first assembling side surface; the second sealing member includes a second base and a second protuberance protruding form the second base, the second protuberance and the second base form the second assembling side surface.

3. The sealing assembly as claimed in claim 2, wherein the first protuberance has two spaced apart first blocks protruding from a surface thereof opposite to the first assembling side surface; the second protuberance has two spaced apart second blocks protruding from a surface thereof opposite to the second assembling side surface.

4. The sealing assembly as claimed in claim 3, wherein the first protuberance has a post protruding from each end of the first assembling side surface, each end of the second protuberance has a through hole defined therethrough corresponding to the post for sealing assembly with each other.

* * * * *